(12) United States Patent
Im

(10) Patent No.: US 8,541,784 B2
(45) Date of Patent: Sep. 24, 2013

(54) ORGANIC LIGHT-EMITTING DISPLAY

(75) Inventor: Ki-Ju Im, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 90 days.

(21) Appl. No.: 13/157,174

(22) Filed: Jun. 9, 2011

(65) Prior Publication Data

US 2011/0303918 A1 Dec. 15, 2011

(30) Foreign Application Priority Data

Jun. 11, 2010 (KR) .................. 10-2010-0055461

(51) Int. Cl.
 *H01L 29/04* (2006.01)
 *H01L 31/20* (2006.01)
 *H01L 31/036* (2006.01)
 *H01L 31/0376* (2006.01)

(52) U.S. Cl.
 USPC ............................... 257/59; 257/40; 438/34

(58) Field of Classification Search
 USPC .................. 257/40, 59, E33.064; 438/34
 See application file for complete search history.

(56) References Cited

U.S. PATENT DOCUMENTS

| 7,227,184 B2 * | 6/2007 | Park et al. ............... 257/59 |
| 2006/0011918 A1 | 1/2006 | Kim |
| 2008/0078993 A1 * | 4/2008 | Cho et al. ............... 257/40 |

FOREIGN PATENT DOCUMENTS

| JP | 2007-250306 A | 9/2007 |
| KR | 10-2001-0093821 A | 10/2001 |
| KR | 10-2004-0033395 A | 4/2004 |
| KR | 10-0495702 B1 | 6/2005 |
| KR | 10-2007-0063699 A | 6/2007 |
| KR | 10-2008-0052080 A | 6/2008 |
| KR | 10-2009-0120698 A | 11/2009 |
| WO | WO 2004/075607 A1 | 9/2004 |

OTHER PUBLICATIONS

Korean Registration Determination Certificate dated Jul. 19, 2012 for Korean Patent Application No. KR 10-2010-0055461 which corresponds to captioned U.S. Appl. No. 13/157,174.

* cited by examiner

*Primary Examiner* — Phuc Dang
(74) *Attorney, Agent, or Firm* — Knobbe, Martens, Olson & Bear LLP

(57) ABSTRACT

An organic light-emitting display and a method of manufacturing the display are disclosed. In one embodiment, the organic light-emitting display includes a thin film transistor comprising: i) a gate electrode, ii) an active layer electrically insulated from the gate electrode, iii) a source electrode and a drain electrode electrically insulated from the gate electrode, and contacting the active layer and iv) an insulating layer formed between i) the source and drain electrodes and ii) the active layer. The display further includes an organic light-emitting device electrically connected to the thin film transistor. In one embodiment, the source electrode comprises a first source electrode and a second source electrode that are separated from each other, and a third source electrode electrically connecting the first and second source electrodes. Moreover, the drain electrode comprises a first drain electrode and a second drain electrode that are separated from each other, and a third drain electrode electrically connecting the first and second drain electrodes.

10 Claims, 10 Drawing Sheets

ORGANIC LIGHT-EMITTING DISPLAY

CROSS-REFERENCE TO RELATED PATENT APPLICATION

This application claims the benefit of Korean Patent Application No. 10-2010-0055461, filed on Jun. 11, 2010, in the Korean Intellectual Property Office, the disclosure of which is incorporated herein in its entirety by reference.

BACKGROUND

1. Field

The described technology generally relates to an organic light-emitting display and a method of manufacturing the same, and more particularly, to an organic light-emitting display including a thin film transistor (TFT) and a method of manufacturing the organic light-emitting display.

2. Description of the Related Technology

In general, flat panel displays are classified into light-emitting type and light-receiving type. Light-emitting type displays may include flat cathode ray tubes, plasma display panels, electro luminescent devices, and light-emitting diodes. Light-receiving type displays may include liquid crystal displays (LCDs). Electro luminescent devices have desirable characteristics such as wide viewing angles, high contrast, and fast response speeds. The electroluminescent devices may be classified into inorganic and organic type according to a material used to form a light-emitting layer.

Organic electroluminescent devices are self-emissive and emit light by electrically exciting fluorescent organic compounds. They are considered as the next generation display that may address problems of LCDs because the devices have characteristics of low power consumption, a thin profile, wide viewing angles and fast response speeds.

The organic electroluminescent devices include a light-emission layer formed of an organic material between an anode electrode and a cathode electrode. As positive and negative voltages are applied respectively to the anode and cathode electrodes, holes injected from the anode electrode are moved to the light-emission layer through a hole transport layer (HTL) and electrons are injected from the cathode electrode and moved to the light-emission layer through an electron transport layer (ETL), and then, the holes and electrons are recombined in the light-emission layer to generate excitons.

As the excitons are changed from an excited state to a base state, fluorescent molecules in the light-emission layer emit light to form images. In a full-color type organic electroluminescent device, pixels that emit red (R), green (G), and blue (B) lights are formed to realize full-color images.

On the other hand, a thin film transistor (TFT) used in flat panel displays, such as the electroluminescent devices and LCDs, is used as a switching device for controlling operations of each of the pixels, or a driving device for driving the pixels. The TFT includes on a substrate a semiconductor active layer having a drain region and a source region doped with impurities of a high concentration, and a channel region between the drain and source regions, a gate insulating layer formed on the semiconductor active layer, and a gate electrode formed on an upper portion of the channel region of the semiconductor active layer.

SUMMARY

One inventive aspect is an organic light-emitting display that prevents electrical breakdown and degradation of the display caused by an electric field that is strongly applied to corners of source and drains, and a method of manufacturing the organic light-emitting display.

Another aspect is an organic light-emitting display including: a thin film transistor including: a gate electrode; an active layer insulated from the gate electrode; a source electrode and a drain electrode insulated from the gate electrode, and contacting the active layer; and an insulating layer disposed between the source and drain electrodes and the active layer; and an organic light-emitting device electrically connected to the thin film transistor, wherein the source electrode may include a first source electrode and a second source electrode that are separated from each other, and a third source electrode electrically connecting the first and second source electrodes to each other, and the drain electrode comprises a first drain electrode and a second drain electrode that are separated from each other, and a third drain electrode electrically connecting the first and second drain electrodes to each other.

The first source electrode and the first drain electrode may be formed on portions corresponding to the active layer.

The source and drain electrodes may not be formed on portions corresponding to corners of the gate electrode.

The first and second source electrodes and the first and second drain electrodes may be formed flat.

The first and second source electrodes and the first and second drain electrodes may be formed on upper portions of plane portions of the insulating layer.

A passivation layer may be disposed between the thin film transistor and the organic light-emitting device so as to cover the source and drain electrodes.

Holes may be formed in the passivation layer so as to expose at least a part of each of the first and second source electrodes, and the third source electrode may be formed to fill the holes of the passivation layer and electrically connect the first and second source electrodes to each other, and holes may be formed in the passivation layer so as to expose at least a part of each of the first and second drain electrodes, and the third drain electrode may be formed to fill the holes of the passivation layer and electrically connect the first and second drain electrodes to each other.

The organic light-emitting device may include: a first electrode that is electrically connected to the thin film transistor; an organic layer formed on the first electrode; and a second electrode formed on the organic layer.

The first electrode, the third source electrode, and the third drain electrode may include the same material as each other and at the same layer to be separated from each other by a predetermined distance.

The third source electrode and the third drain electrode may include one or more materials selected from the group consisting of indium tin oxide (ITO), indium zinc oxide (IZO), and ZnO.

Another aspect is a method of manufacturing an organic light-emitting display, the method including: forming a gate electrode on a substrate; forming a gate insulating layer covering the gate electrode on the substrate; forming an active layer on the gate insulating layer; forming an insulating layer covering at least a channel region of the active layer; forming a source electrode and a drain electrode that contact the active layer on the insulating layer; and forming an organic light-emitting device that is electrically connected to one of the source and drain electrodes, wherein the forming of the source and drain electrodes may include: forming a first source electrode and a second source electrode that are separated from each other; forming a third source electrode for electrically connecting the first and second source electrodes to each other; forming a first drain electrode and a second drain electrode that are separated from each other; and forming a third drain electrode for electrically connecting the first and second drain electrodes to each other.

The first source electrode and the first drain electrode may be formed on portions corresponding to the active layer to contact the active layer.

In the forming of the source and drain electrodes, the source and drain electrodes may not be formed on upper portions of corners of the gate electrode.

The first and second source electrodes and the first and second drain electrodes may be formed flat.

The first and second source electrodes and the first and second drain electrodes may be formed on upper portions of plane portions of the insulating layer.

The forming of the organic light-emitting device that is electrically connected to one of the source and drain electrodes may include: electrically connecting a first electrode to the thin film transistor; forming an organic layer on the first electrode; and forming a second electrode on the organic layer.

The first electrode, the third source electrode, and the third drain electrode may include the same material as each other and at the same layer to be separated from each other by a predetermined distance.

Another aspect is a method of manufacturing an organic light-emitting display, the method including: forming a gate electrode on a substrate; forming an active layer, which is insulated from the gate electrode, on the gate electrode; forming an insulating layer on the active layer; forming a conductive layer on the insulating layer; forming a source electrode, a second source electrode, a first drain electrode, and a second drain electrode by patterning the conductive layer; forming a passivation layer covering the first source electrode, the second source electrode, the first drain electrode, and the second drain electrode; forming holes in the passivation layer so as to expose at least a part of each of the first source electrode, the second source electrode, the first drain electrode, and the second drain electrode; forming a third source electrode for electrically connecting the first and second source electrodes to each other, and forming a third drain electrode for electrically connecting the first and second drain electrodes to each other; and forming an organic light-emitting device that is electrically connected to at least one of the first source electrode, the second source electrode, the first drain electrode, and the second drain electrode.

The forming of the third source electrode and the third drain electrode may include: forming the third source electrode by filling the holes that are formed in the passivation layer so as to expose at least a part of each of the first and second source electrodes; and forming the third drain electrode by filling the holes that are formed in the passivation layer so as to expose at least a part of each of the first and second drain electrodes.

The first and second source electrodes and the first and second drain electrodes may be formed flat.

The first and second source electrodes and the first and second drain electrodes may be formed on upper portions of plane portions of the insulating layer.

The first electrode, the third source electrode, and the third drain electrode may include the same material as each other and at the same layer to be separated from each other by a predetermined distance.

Another aspect is an organic light-emitting display comprising: a thin film transistor comprising: a gate electrode; an active layer electrically insulated from the gate electrode; a source electrode and a drain electrode electrically insulated from the gate electrode, and contacting the active layer; and an insulating layer formed between i) the source and drain electrodes and ii) the active layer; and an organic light-emitting device electrically connected to the thin film transistor, wherein the source electrode comprises a first source electrode and a second source electrode that are separated from each other, and a third source electrode electrically connecting the first and second source electrodes, and wherein the drain electrode comprises a first drain electrode and a second drain electrode that are separated from each other, and a third drain electrode electrically connecting the first and second drain electrodes.

In the above display, the first source electrode and the first drain electrode are formed substantially directly above the active layer. In the above display, i) the first and second source electrodes and ii) the first and second drain electrodes are not formed substantially directly above edges of the gate electrode. In the above display, the second source electrode and the second drain electrode are formed substantially flat and substantially parallel with the gate electrode.

In the above display, the third source electrode includes a first portion which is substantially directly above a first edge of the gate electrode, wherein the third drain electrode includes a second portion which is substantially directly above a second edge of the gate electrode opposing the first edge, and wherein the first and second portions of the third source and drain electrodes are substantially parallel with the gate electrode.

In the above display, the insulating layer has a flat portion and a non-flat portion, wherein i) at least part of the first source electrode, ii) at least part of the first drain electrode and iii) the second source and drain electrodes are formed on the flat portion of the insulating layer, and wherein at least part of the third source electrode and at least part of the third drain electrode are formed substantially directly above the non-flat portion of the insulating layer.

The above display further comprises a passivation layer formed between the thin film transistor and the organic light-emitting device so as to cover the source and drain electrodes. In the above display, the organic light-emitting device comprises an electrode electrically connected to the thin film transistor, wherein the electrode, the third source electrode, and the third drain electrode are i) formed of the same material, ii) separated from each other and iii) formed in the same plane which is substantially parallel with the gate electrode. In the above display, the third source electrode and the third drain electrode is formed of at least one of the following: indium tin oxide (ITO), indium zinc oxide (IZO), and ZnO.

Another aspect is a method of manufacturing an organic light-emitting display, the method comprising: forming a gate electrode on a substrate; forming a gate insulating layer on the substrate so as to cover the gate electrode; forming an active layer on the gate insulating layer; forming an insulating layer so as to cover at least a channel region of the active layer; forming a source electrode and a drain electrode on the insulating layer so as to contact the active layer; and forming an organic light-emitting device so as to be electrically connected to one of the source and drain electrodes, wherein the forming of the source and drain electrodes comprises: forming a first source electrode and a second source electrode that are separated from each other; forming a third source electrode so as to electrically connect the first and second source electrodes; forming a first drain electrode and a second drain electrode that are separated from each other; and forming a third drain electrode so as to electrically connect the first and second drain electrodes.

In the above method, the first source electrode and the first drain electrode are formed substantially directly above and contact the active layer. In the above method, i) the first and second source electrodes and ii) the first and second drain electrodes are not formed substantially directly above edges of the gate electrode. In the above method, the second source electrode and the second drain electrode are formed substantially flat and substantially parallel with the gate electrode.

In the above method, the insulating layer has a flat portion and a non-flat portion, wherein i) at least part of the first source electrode, ii) at least part of the first drain electrode and iii) the second source and drain electrodes are formed on the flat portion of the insulating layer, and wherein at least part of the third source electrode and at least part of the third drain electrode are formed substantially directly above the non-flat portion of the insulating layer.

In the above method, the organic light-emitting device comprises an electrode electrically connected to the thin film transistor, wherein the electrode, the third source electrode, and the third drain electrode is i) formed of the same material, ii) separated from each other and iii) formed in the same plane which is substantially parallel with the gate electrode. In the above method, the third source electrode includes a first portion which is substantially directly above a first edge of the gate electrode, wherein the third drain electrode includes a second portion which is substantially directly above a second edge of the gate electrode opposing the first edge, and wherein the first and second portions of the third source and drain electrodes are substantially parallel with the gate electrode.

Another aspect is a method of manufacturing an organic light-emitting display, the method comprising: forming a gate electrode on a substrate; forming an active layer on the gate electrode so as to be electrically insulated from the gate electrode; forming an insulating layer on the active layer; forming a conductive layer on the insulating layer; patterning the conductive layer so as to form first and second source electrodes, and first and second drain electrodes; forming a passivation layer so as to cover the first and second source electrodes, and the first and second drain electrodes; forming holes in the passivation layer so as to expose at least part of each of the first source electrode, the second source electrode, the first drain electrode, and the second drain electrode; forming a third source electrode so as to electrically connect the first and second source electrodes; forming a third drain electrode so as to electrically connect the first and second drain electrodes; and forming an organic light-emitting device so as to be electrically connected to at least one of the first source electrode, the second source electrode, the first drain electrode, and the second drain electrode.

In the above method, the forming of the third source electrode and the third drain electrode comprises: filling the holes that are formed in the passivation layer so as to expose at least part of each of the first and second source electrodes; and filling the holes that are formed in the passivation layer so as to expose at least a part of each of the first and second drain electrodes.

DETAILED DESCRIPTION

Hereinafter, embodiments will be described in detail with reference to accompanying drawings.

Figure 1:
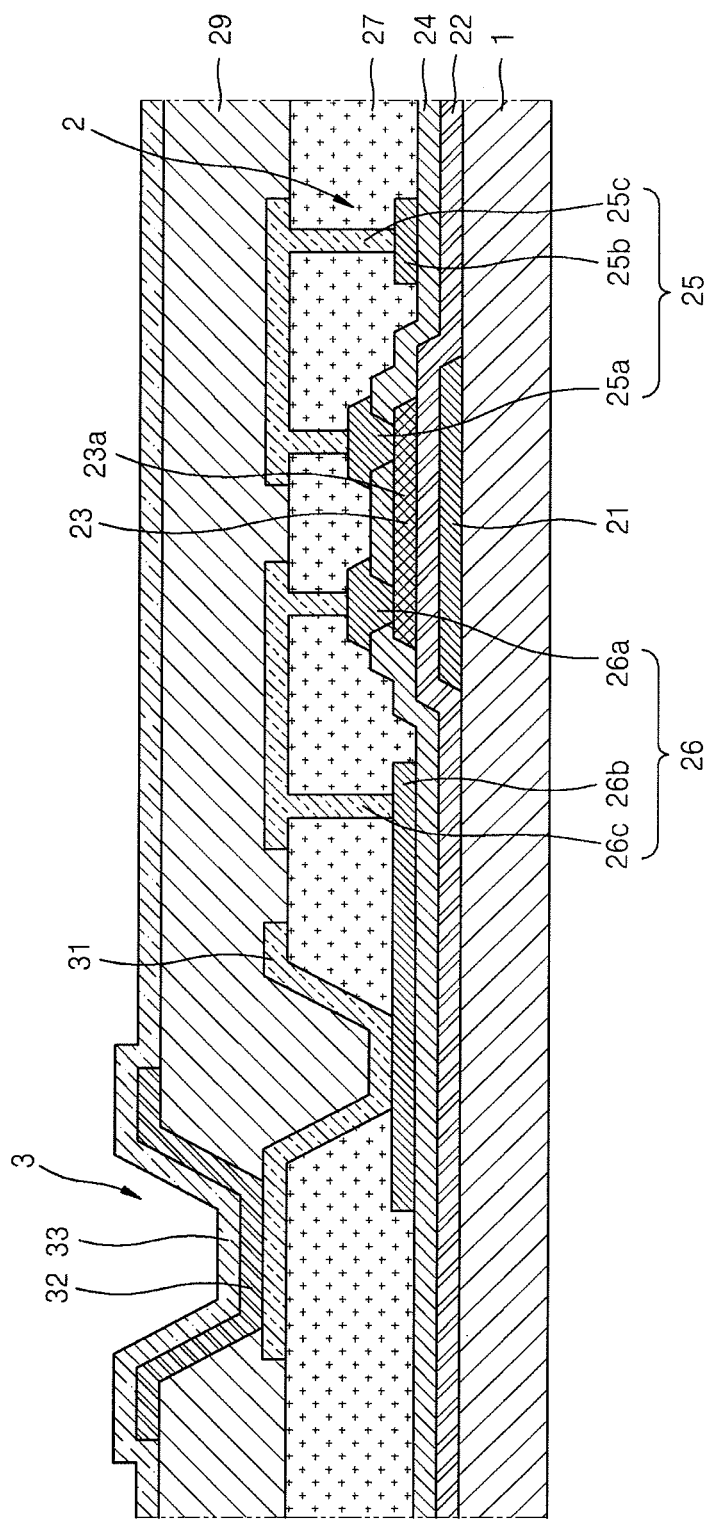
FIG. 1 is a schematic cross-sectional view of an organic light-emitting display according to an embodiment.

FIG. 1 is a schematic cross-sectional view of an organic light-emitting display according to an embodiment.

Referring to FIG. 1, a thin film transistor (TFT) 2 and an organic light-emitting device 3 are formed on a substrate 1. The organic light-emitting display includes a plurality of pixels, but only part of a pixel is shown in FIG. 1, for the convenience of explanation.

The TFT 2 includes a gate electrode 21 formed on the substrate 1, a gate insulating layer 22 covering the gate electrode 21, an active layer 23 formed on the gate insulating layer 22, an insulating layer 24 formed on the gate insulating layer 22 to cover the active layer 23, and a source electrode 25 and a drain electrode 26 that are formed on the insulating layer 24 to contact the active layer 23. In one embodiment, as shown in FIG. 1, the TFT 2 has a bottom gate structure. Another embodiment includes a TFT of top gate structure.

A buffer layer (not shown) may be further formed of an inorganic material such as silicon oxide on the substrate 1.

The gate electrode 21 formed on the substrate 1 may be formed of conductive metal as a single-layer structure or a multi-layered structure. The gate electrode 21 may include molybdenium.

The gate insulating layer 22 may be formed at least partially of silicon oxide, tantalum oxide, or aluminum oxide, and the present invention is not limited thereto.

The patterned active layer 23 is formed on the gate insulating layer 22. The active layer 23 may be formed of an inorganic semiconductor or an organic semiconductor. Source and drain regions of the active layer 23 may be doped with n-type or p-type impurities, and a channel region 23a is formed between the source and drain regions to connect the source and drain regions.

The inorganic semiconductor for forming the active layer 23 may include CdS, GaS, ZnS, CdSe, CaSe, ZnSe, CdTe, SiC, or Si.

In addition, the organic semiconductor for forming the active layer 23 may include polymer, for example, polythiophene and derivatives thereof, poly(p-phenylene vinylene) and derivatives thereof, poly(p-phenylene) and derivatives thereof, polyfluorene and derivatives thereof, polythiophene vinylene and derivatives thereof, or polythiophene-heterocyclic aromatic copolymer and derivatives thereof, and low-molecules, for example, pentacene, tetracene, oligo-acene of naphthalene and derivatives thereof, oligo-thiophene of alpha-6-thiophene and alpha-5-thiophene and derivatives thereof, phthalocyanine including metal or excluding metal and derivatives thereof, pyromellitic dianhydride or pyromellitic diimide and derivatives thereof, perylene tetracarboxylic acid dianhydride or perylene tetracarboxylic diimide and derivatives thereof.

In addition, the active layer 23 may be formed of an oxide semiconductor, in particular, one or more elements selected from the group consisting of gallium (Ga), indium (In), zinc (Zn), and tin (Sn), and oxygen. For example, the active layer 23 may include ZnO, ZnGaO, ZnInO, GaInO, GaSnO, ZnSnO, InSnO, HfInZnO, or ZnGaInO, that is, a G-I—Z—O layer [a($In_2O_3$)b($Ga_2O_3$)c(ZnO) layer] (a, b, and c are real numbers, each satisfying conditions a≥0, b≥0, c>0).

The insulating layer 24 is formed to cover the active layer 23. The insulating layer 24 protects the channel region 23a of the active layer 23. The insulating layer 24 may cover the active layer 23 except for portions contacting the source and drain electrodes 25 and 26. However, the insulating layer 24 may be formed only on the channel region 23a.

On the other hand, the source electrode 25 and the drain electrode 26 are formed on the insulating layer 24 to contact the active layer 23.

Here, in the organic light-emitting display of the current embodiment, the source electrode 25 and the drain electrode 26 respectively include a first electrode and a second electrode separated from each other, and a third electrode connecting the first and second electrodes to each other, as will be described in more detail later.

In addition, a passivation layer 27 is formed on the insulating layer 24 to cover the source and drain electrodes 25 and 26, and a first electrode 31 of the organic light-emitting device 3, which contacts the drain electrode 26, is formed on the passivation layer 27.

A pixel defining layer (PDL) 29 that exposes part of the first electrode 31 is formed on the passivation layer 27, and an organic layer 32 and a second electrode 33 are sequentially formed on the exposed portion of the first electrode 31.

The PDL 29 is formed to cover edges of the first electrode 31. The PDL 29 defines light-emission regions, and also increases a distance between the edge of the first electrode 31 and the second electrode 33 so as to prevent an electric field from concentrating on the edge portion of the first electrode 31. Thus, a short circuit between the first electrode 31 and the second electrode 33 is prevented.

The first electrode 31 is patterned in each of the pixels. If the organic light-emitting display is a top emission type in which images are displayed toward a direction of the second electrode 33, the first electrode 31 may be a reflective electrode. To this end, the first electrode 31 may include a reflective layer formed of an alloy of Al and Ag.

When the first electrode 31 is used as the anode electrode, the first electrode 31 includes a layer formed of metal oxide having a high work function, such as indium tin oxide (ITO), indium zinc oxide (IZO), and ZnO. When the first electrode 31 is used as the cathode electrode, highly conductive metal having a low work function, such as Ag, Mg, Al, Pt, Pd, Au, Ni, Nd, Ir, Cr, Li, or Ca may be used. Therefore, in this case, the reflective layer is not necessary.

The second electrode 33 may be a light-transmitting electrode. Thus, the second electrode 33 may include a transflective layer that is a thin film formed of Ag, Mg, Al, Pt, Pd, Au, Ni, Nd, Ir, Cr, Li, or Ca, or may include a light-transmitting metal oxide such as ITO, IZO, or ZnO. When the first electrode 31 is the anode, the second electrode 33 is the cathode, and when the first electrode 31 is the cathode, the second electrode 33 is the anode.

The organic layer 32 disposed between the first and second electrodes 31 and 33 may selectively include a hole injection layer (HIL), a hole transport layer (HTL), an emission layer (EML), an electron transport layer (ETL), and an electron injection layer (EIL). However, the EML is essentially formed.

Although not shown in FIG. 1, a protective layer may be further formed on the second electrode 33, and a sealing process using glass may be performed.

Hereinafter, the source and drain electrodes 25 and 26 in the organic light-emitting display of the current embodiment will be described in detail.

Source and drain electrodes in a conventional organic light-emitting display (not necessarily prior art) are formed to cover both ends of the gate electrode, and thus, the source and drain electrodes have inclined portions on corners of the gate electrode. However, due to a strong electric field between the corners of the gate electrode and the source and drain electrodes, electrical breakdown may occur at the inclined portions of the source/drain electrodes, and thus, defects may occur.

To address the above-described problem, in the organic light-emitting device of the current embodiment, inclined portions of the source/drain electrodes are removed by a patterning process, and after that, separate portions are electrically connected as the same layer of a pixel electrode when the pixel electrode is formed. Thus, the breakdown occurring due to the electric field generated on the inclined portions of the source/drain electrodes may be prevented.

For example, when the source and drain electrodes 25 and 26 are formed by forming a hole in the insulating layer 24, applying a material, such as metal or conductive metal oxide, on the insulating layer 24, and patterning the applied material, intermediate portions of the source and drain electrodes 25 and 26, that is, inclined portions of the source and drain electrodes 25 and 26 corresponding to corners of the gate electrode 21 are patterned to be removed. Then, the source electrode 25 is divided into a first source electrode 25a and a second source electrode 25b. Here, the first source electrode 25a is formed on the active layer 23, and the second source electrode 25b is formed on a portion where the active layer 23 is not formed. The first and second source electrodes 25a and 25b are formed substantially flat without inclined portions. Likewise, a first drain electrode 26a is formed on the active layer 23, and a second drain electrode 26b is formed on a portion where the active layer 23 is not formed. The first and second drain electrodes 26a and 26b are formed substantially flat without inclined portions.

In addition, the passivation layer 27 is formed to cover the source and drain electrodes 25 and 26, and the first electrode 31 of the organic light-emitting device 3, which contacts the drain electrode 26, is formed on the passivation layer 27. In more detail, a hole is formed in the passivation layer 27 and a material, such as metal or conductive metal oxide, that is applied on the passivation layer 27 is patterned, and then, the first electrode 31, a third source electrode 25c, and a third drain electrode 26c are formed. Here, the third source electrode 25c is formed to connect the first and second source electrodes 25a and 25b to each other, and the third drain electrode 26c is formed to connect the first and second drain electrodes 26a and 26b to each other.

As described above, the inclined portions of the source and drain electrodes 25 and 26 are removed, and separate portions of the source and drain electrodes 25 and 26 are connected by using, for example, an ITO electrode. Then, the breakdown occurring due to the inclined portions of the source and drain electrodes 25 and 26 may be prevented, and defects of the organic light-emitting device 3 may be reduced.

Next, a method of fabricating the source/drain electrodes according to an embodiment will be described in detail.

FIGS. 2 through 14 are cross-sectional views illustrating processes of fabricating the organic light-emitting display of FIG. 1, according to an embodiment.

Figure 2:
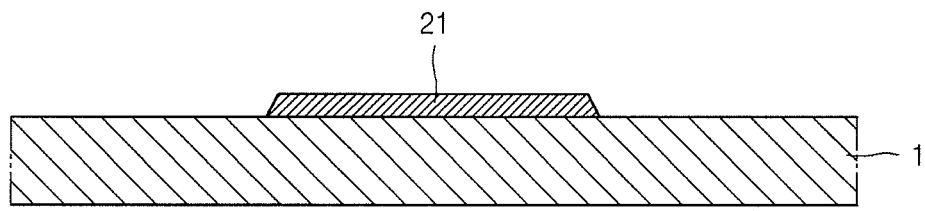
FIGS. 2 through 14 are cross-sectional views illustrating a method of manufacturing an organic light-emitting display according to an embodiment.

Referring to FIG. 2, the substrate 1 is prepared. The substrate 1 may be formed of silicon (Si), glass, or an organic material. When the substrate 1 is a Si substrate, an insulating layer (not shown) may be further formed on a surface of the substrate 1 by a thermal oxidation process. Next, a conductive material, such as metal or conductive metal oxide, is applied on the substrate 1 and patterned to form the gate electrode 21.

Figure 3:
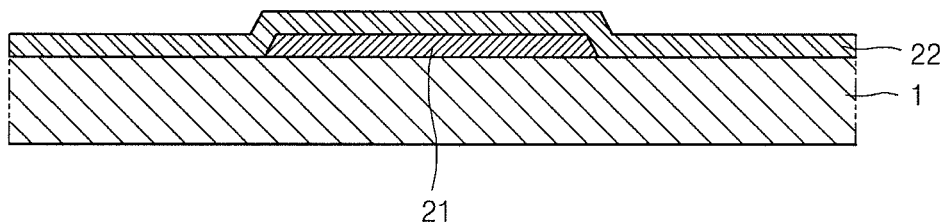

Referring to FIG. 3, an insulating material is applied on the gate electrode 21 and patterned to form the gate insulating layer 22.

Figure 4:
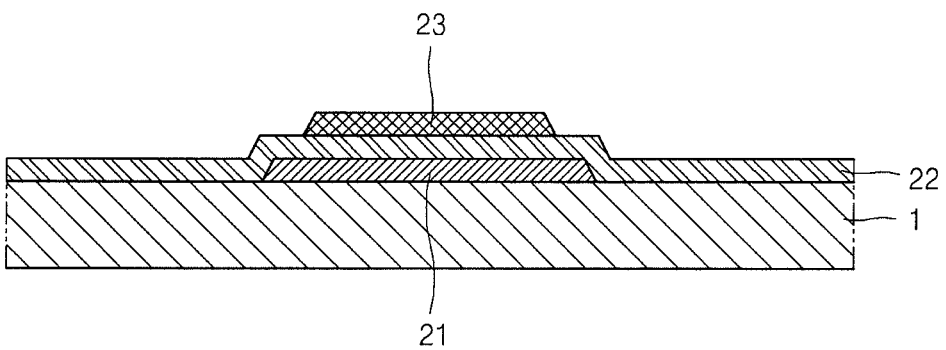

In addition, referring to FIG. 4, a semiconductor material is applied on a portion of the gate insulating layer 22, which corresponds to the gate electrode 21, for example, in a physical vapor deposition (PVD) method, a chemical vapor deposition (CVD) method, or an atomic layer deposition (ALD) method, and then, patterned to form the active layer 23. The semiconductor material may be selected from an inorganic semiconductor or an organic semiconductor. In addition, the active layer 23 may be formed of an oxide semiconductor, for example, a G-I—Z—O layer [a(In$_2$O$_3$)b(Ga$_2$O$_3$)c(ZnO) layer] (a, b, and c are real numbers, each satisfying conditions a≥0, b≥0, c>0).

Figure 5:
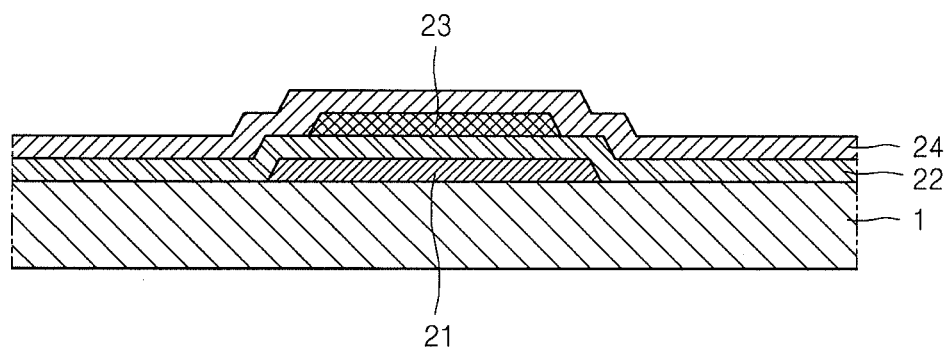

Referring to FIG. 5, the insulating layer 24 is formed to cover the active layer 23. Here, the insulating layer 24 may perform as an etch stop layer.

Figure 6:
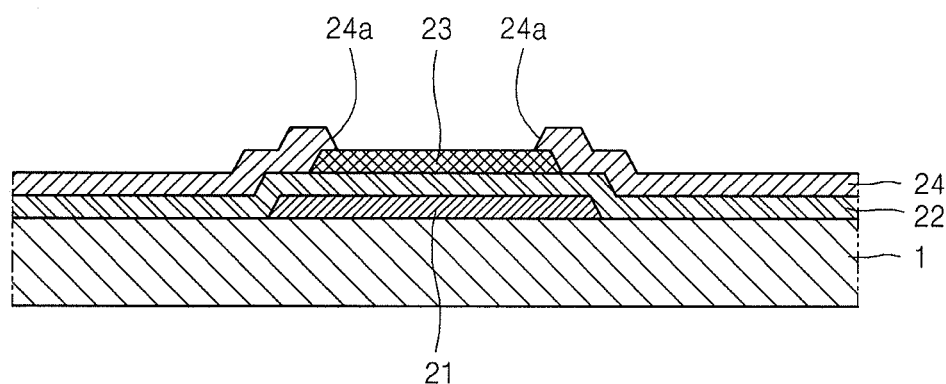
Figure 7:
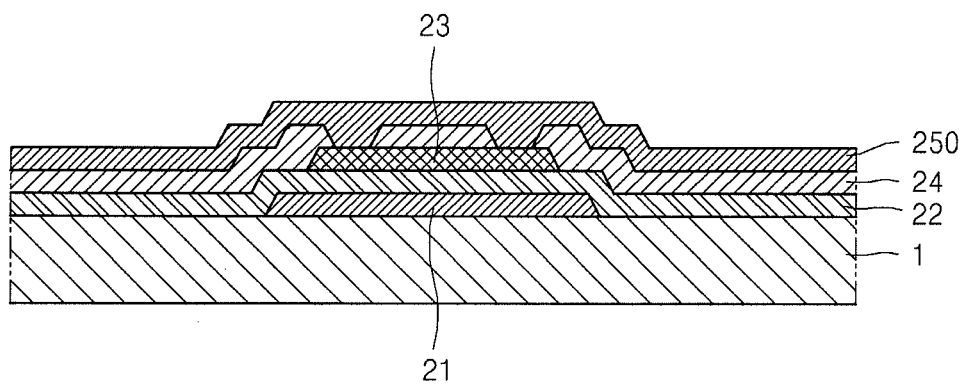
Figure 8:
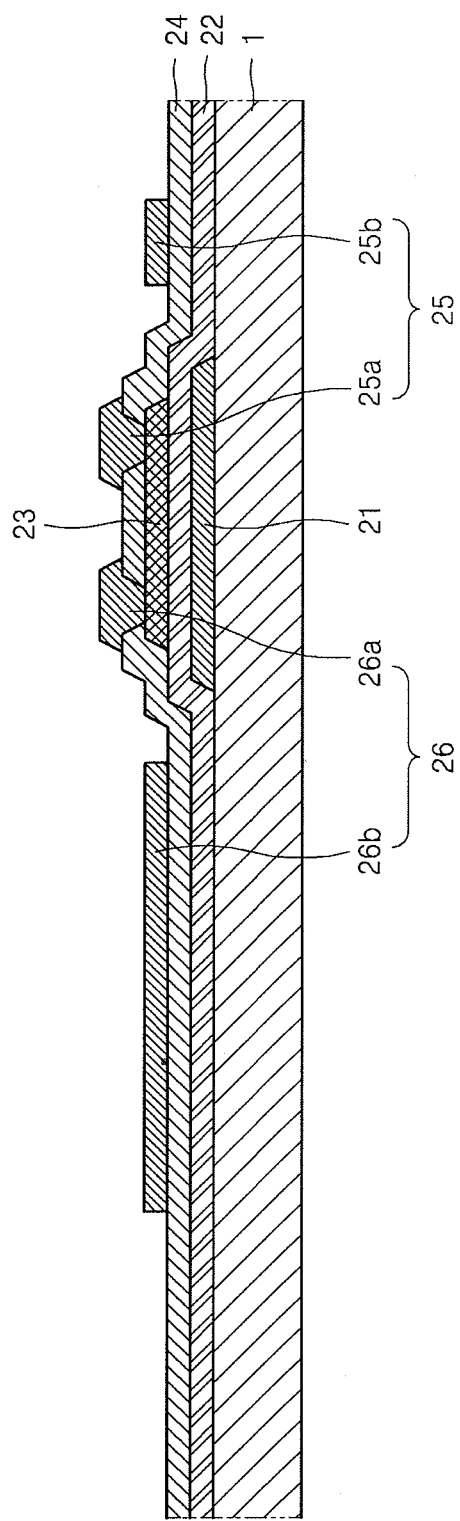

Next, as shown in FIG. 6, a hole 24a is formed in the insulating layer 24, and as shown in FIG. 7, a conductive layer 250 formed of, for example, metal or conductive metal oxide is applied on the insulating layer 24. Then, as shown in FIG. 8, the conductive layer 250 is patterned to be connected to both sides of the active layer 23 to form the source and drain electrodes 25 and 26.

In one embodiment, when the conductive layer 250 is formed on the insulating layer 24, portions of the conductive layer 250 corresponding to corners of the gate insulating layer 22 are inclined. When the source and drain electrodes 25 and 26 are formed including the inclined portions, the breakdown may occur at the inclined portions of the source and drain electrodes 25 and 26 due to a strong electric field between the corners of the gate electrode 21 and the source and drain electrodes 25 and 26, and thus, defects of the organic light-emitting display may be generated. In one embodiment, to address the above-described problem, the inclined portions of the source and drain electrodes 25 and 26 are patterned to be removed, in the organic light-emitting display. That is, each of the source and drain electrodes 25 and 26 is divided into two separate portions. Then, the source electrode 25 includes the first and second source electrodes 25a and 25b that are separated from each other. Here, the first source electrode 25a is formed on the active layer 23, and the second source electrode 25b is formed on the portion where the active layer 23 is not formed. In one embodiment, the first and second source electrodes 25a and 25b are formed substantially flat without including the inclined portions. Likewise, the first drain electrode 26a is formed on the upper portion of the active layer 23, and the second drain electrode 26b is formed on the portion where the active layer 23 is not formed. In one embodiment, the first and second drain electrodes 26a and 26b are formed substantially flat without including the inclined portions.

Here, both end portions of the first source electrode 25a and the first drain electrode 26a may be formed on insides of both end portions of the gate electrode 21. That is, the first source electrode 25a and the first drain electrode 26a are formed on the upper portion of the gate electrode 21, and entire portions of the first source electrode 25a and the first drain electrode 26a overlap with the gate electrode 21. It is because affects of fields generating on sharp corners of the gate electrode 21 to the first source electrode 25a and the first drain electrode 26a may be reduced only when the both end portions of the first source electrode 25a and the first drain electrode 26a are formed on insides of the both end portions of the gate electrode 21, and thereby improving device reliability.

Figure 9:
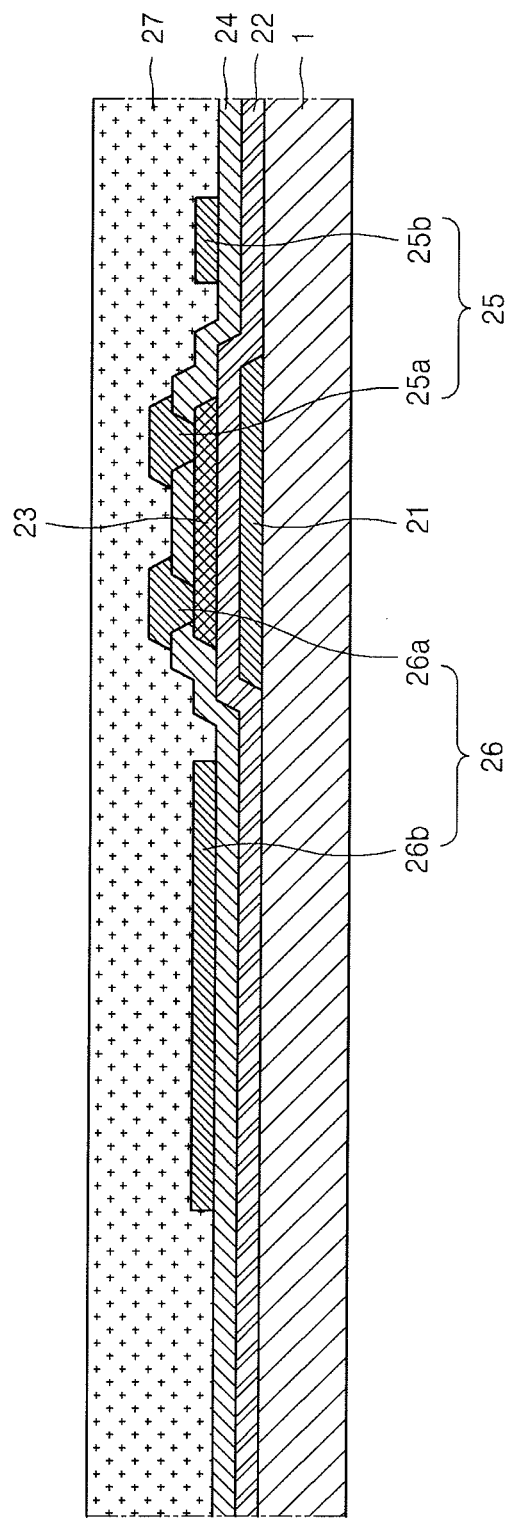
Figure 10:
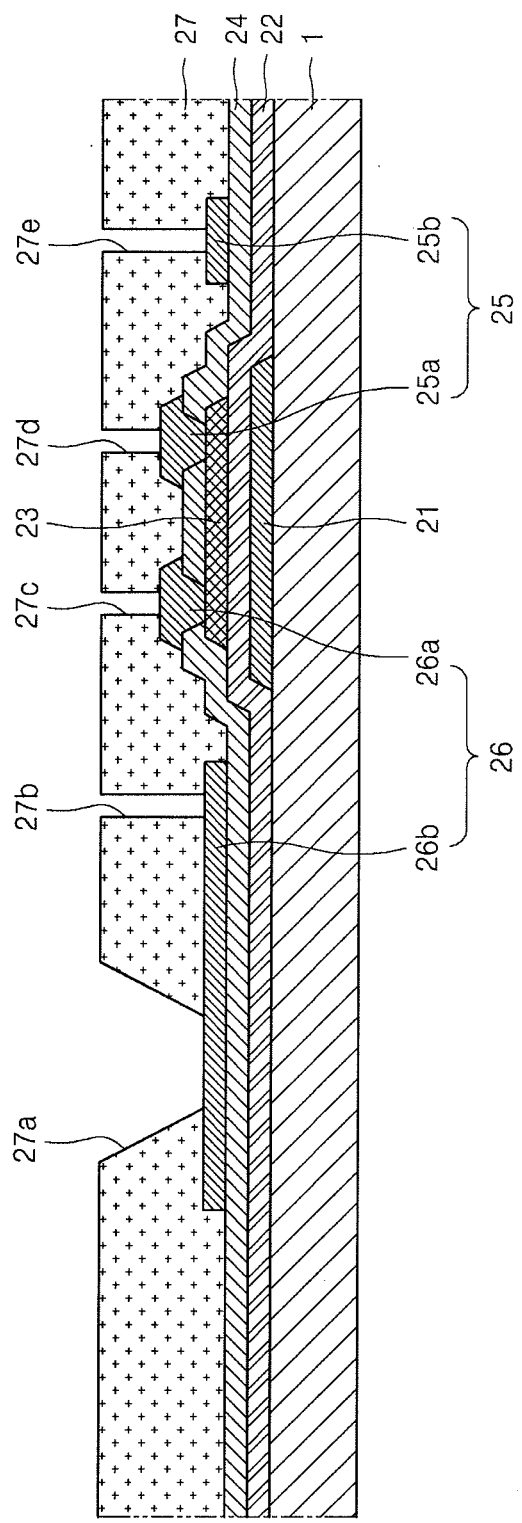

Next, as shown in FIG. 9, the passivation layer 27 is formed to cover the source and drain electrodes 25 and 26, and as shown in FIG. 10, first through fifth holes 27a, 27b, 27c, 27d, and 27e are formed in the passivation layer 27. The first hole 27a is formed in a portion corresponding to the second drain electrode 26b so that the first electrode 31 that will be described later may contact the second drain electrode 26b. In addition, the second hole 27b is formed in a portion corresponding to the second drain electrode 26b so as to expose the second drain electrode 26b, and the third hole 27c is formed in a portion corresponding to the first drain electrode 26a so as to expose the first drain electrode 26a. The fourth hole 27d is formed in a portion corresponding to the first source electrode 25a so as to expose the first source electrode 25a, and the fifth hole 27e is formed in a portion corresponding to the second source electrode 25b so as to expose the second source electrode 25b.

Figure 11:
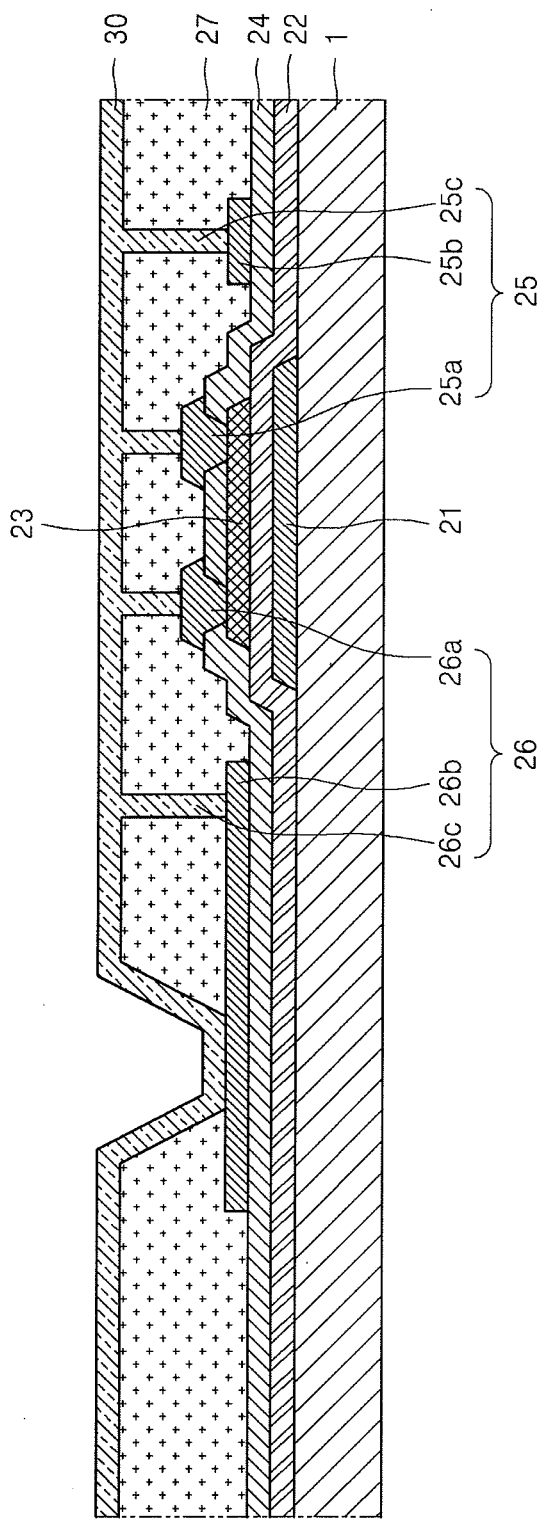

Next, as shown in FIG. 11, a conductive layer 30 formed of metal or conductive metal oxide is applied on the passivation layer 27. The conductive layer 30 is formed to fill the holes 27a, 27b, 27c, 27d, and 27e formed in the passivation layer 27.

Figure 12:
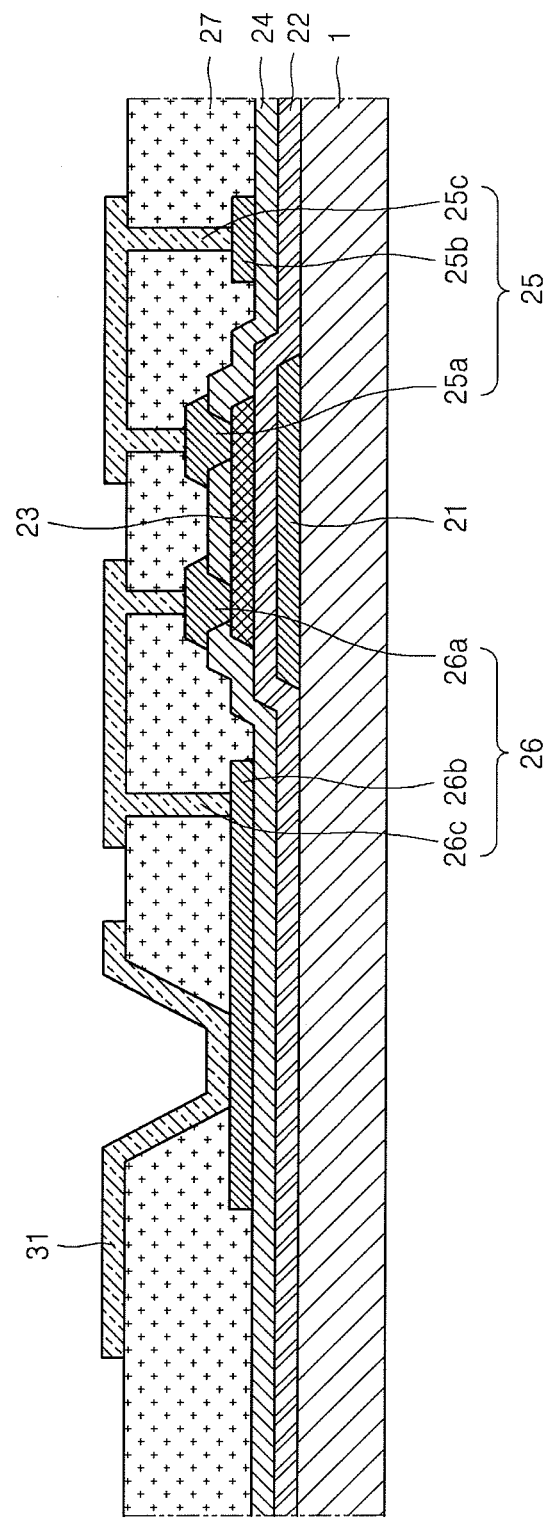

In addition, as shown in FIG. 12, the first electrode 31, the third source electrode 25c, and the third drain electrode 26c are formed. Here, the first electrode 31 is formed to contact the second drain electrode 26b. In addition, the third source electrode 25c is formed to connect the first and second source electrodes 25 and 25b to each other, and the third drain electrode 26c is formed to connect the first and second drain electrodes 26a and 26b to each other. As described above, the third source electrode 25c and the third drain electrode 26c are formed of the same material as the first electrode 31 and at the same layer as the first electrode 31 in order to connect the separate portions of the source and drain electrodes 25 and 26, and thus, the breakdown may be prevented without performing an additional mask process.

Figure 13:
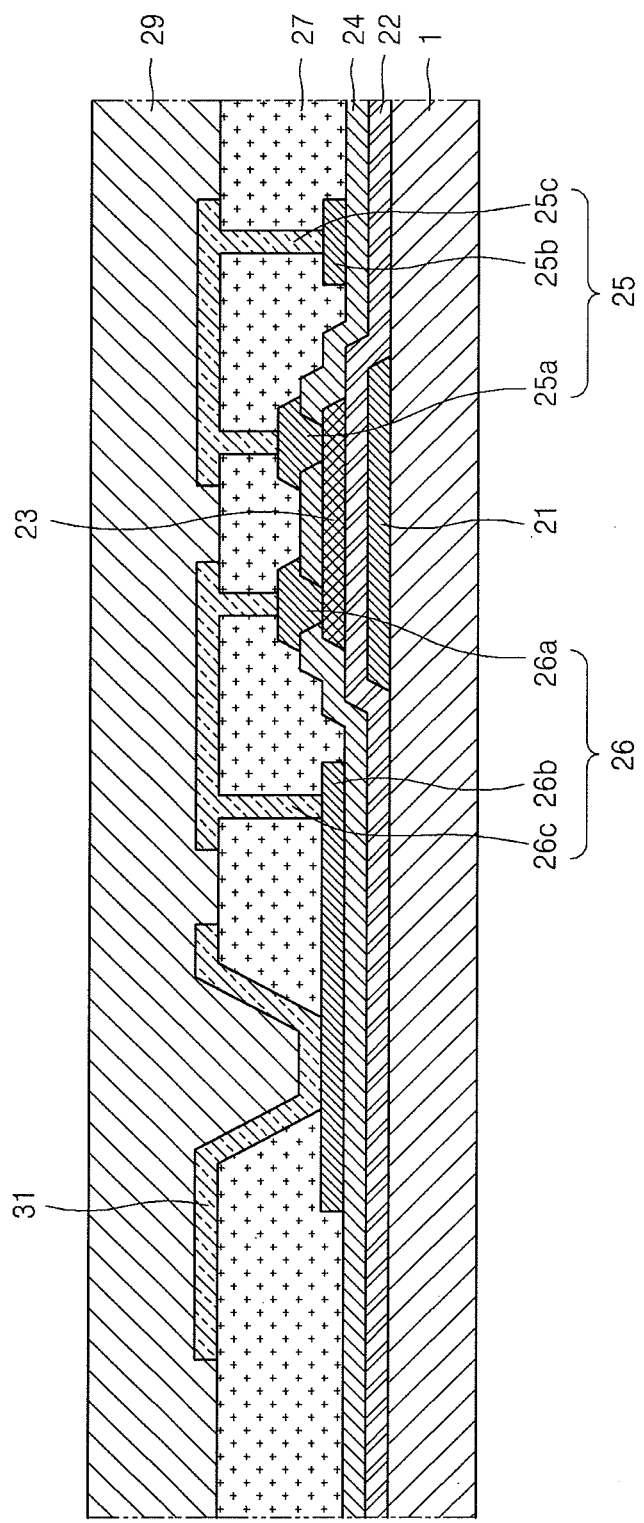
Figure 14:
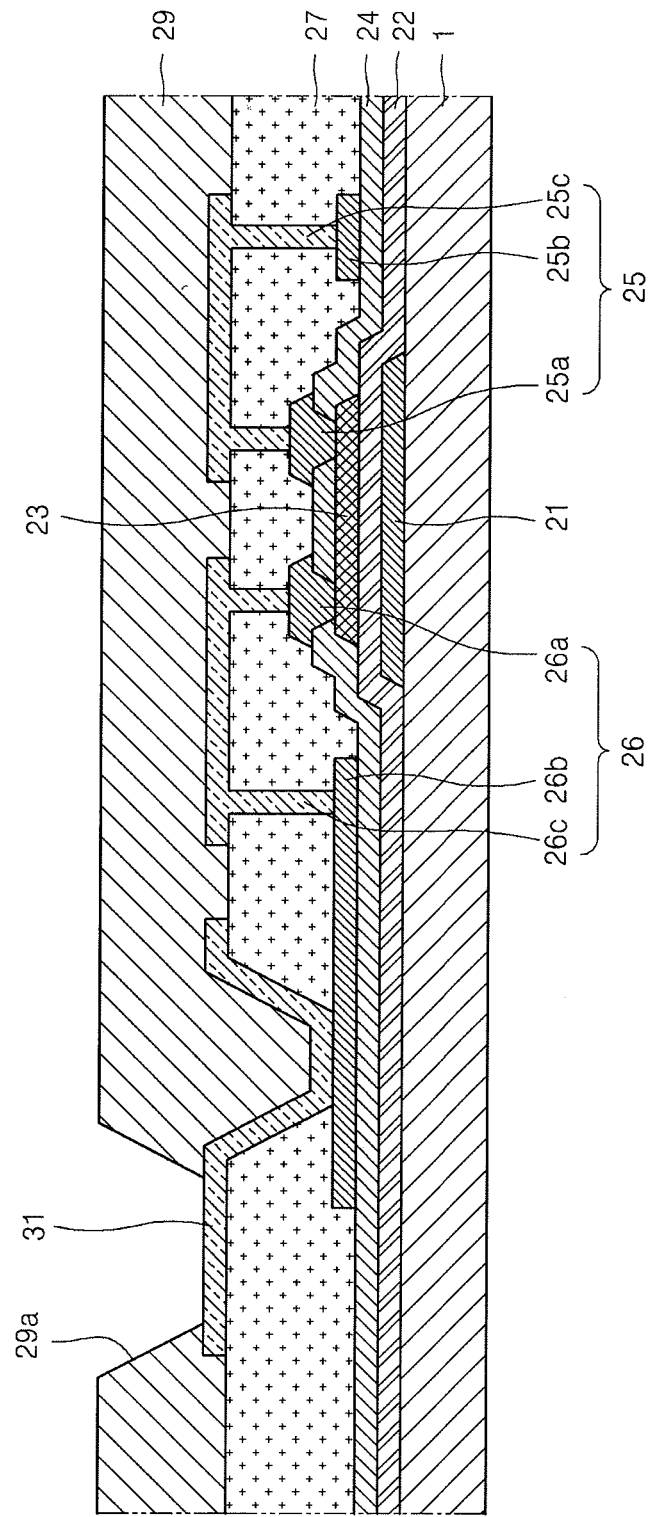

Next, as shown in FIG. 13, the PDL 29 formed of an insulating material is formed on the passivation layer 27, and as shown in FIG. 14, the PDL 29 is patterned to form a hole 29a therein so as to expose a part of the first electrode 31.

In addition, the organic layer 32 and the second electrode 33 are formed on the exposed portion of the first electrode 31, and then, fabrication of the organic light-emitting display of FIG. 1 is finished.

According to at least one of the disclosed embodiments, inclined portions of the source/drain electrodes are removed, and then, separate portions of the source/drain electrodes are connected by using an ITO electrode. Therefore, electrical breakdown that may occur due to the inclined portions of the source/drain electrodes is prevented, and thus, defects of the organic light-emitting display may be reduced.

Further, the breakdown and the degradation of the display which can be caused by a strong field effect applied to inclined portions of the source/drain electrodes is prevented, and thus, defects of the display are reduced.

While the disclosed embodiments have been particularly shown and described with reference to the drawings, it will be understood by those of ordinary skill in the art that various changes in form and details may be made therein without departing from the spirit and scope of the following claims.

What is claimed is:

1. An organic light-emitting display comprising:
   a thin film transistor comprising:
      a gate electrode;
      an active layer electrically insulated from the gate electrode;
      a source electrode and a drain electrode electrically insulated from the gate electrode, and contacting the active layer; and
      an insulating layer formed between i) the source and drain electrodes and ii) the active layer, wherein the insulating layer contacts the active layer; and
   an organic light-emitting device electrically connected to the thin film transistor,
   wherein the source electrode comprises a first source electrode and a second source electrode that are separated from each other, and a third source electrode electrically connecting the first and second source electrodes, wherein the first and second source electrodes contact the insulating layer, and wherein the drain electrode comprises a first drain electrode and a second drain electrode that are separated from each other, and a third drain electrode electrically connecting the first and second drain electrodes.

2. The organic light-emitting display of claim 1, wherein the first source electrode and the first drain electrode are formed substantially directly above the active layer.

3. The organic light-emitting display of claim 1, wherein i) the first and second source electrodes and ii) the first and second drain electrodes are not formed substantially directly above edges of the gate electrode.

4. The organic light-emitting display of claim 1, wherein the second source electrode and the second drain electrode are formed substantially flat and substantially parallel with the gate electrode.

5. The organic light-emitting display of claim 1, further comprising a passivation layer formed between the thin film transistor and the organic light-emitting device so as to cover the source and drain electrodes.

6. The organic light-emitting display of claim 1, wherein the organic light-emitting device comprises an electrode electrically connected to the thin film transistor, wherein the electrode, the third source electrode, and the third drain electrode are i) formed of the same material, ii) separated from each other and iii) formed in the same plane which is substantially parallel with the gate electrode.

7. The organic light-emitting display of claim 1, wherein the third source electrode and the third drain electrode is formed of at least one of the following: indium tin oxide (ITO), indium zinc oxide (IZO), and ZnO.

8. The organic light-emitting display of claim 1, wherein the first and second drain electrodes contact the insulating layer.

9. An organic light-emitting display comprising:
a thin film transistor comprising:
    a gate electrode;
    an active layer electrically insulated from the gate electrode;
    a source electrode and a drain electrode electrically insulated from the gate electrode, and contacting the active layer; and
    an insulating layer formed between i) the source and drain electrodes and ii) the active layer; and
an organic light-emitting device electrically connected to the thin film transistor,
wherein the source electrode comprises a first source electrode and a second source electrode that are separated from each other, and a third source electrode electrically connecting the first and second source electrodes, and wherein the drain electrode comprises a first drain electrode and a second drain electrode that are separated from each other, and a third drain electrode electrically connecting the first and second drain electrodes,
wherein the third source electrode includes a first portion which is substantially directly above a first edge of the gate electrode, wherein the third drain electrode includes a second portion which is substantially directly above a second edge of the gate electrode opposing the first edge, and wherein the first and second portions of the third source and drain electrodes are substantially parallel with the gate electrode.

10. An organic light-emitting display comprising:
a thin film transistor comprising:
    a gate electrode;
    an active layer electrically insulated from the gate electrode;
    a source electrode and a drain electrode electrically insulated from the gate electrode, and contacting the active layer; and
    an insulating layer formed between i) the source and drain electrodes and ii) the active layer; and
an organic light-emitting device electrically connected to the thin film transistor,
wherein the source electrode comprises a first source electrode and a second source electrode that are separated from each other, and a third source electrode electrically connecting the first and second source electrodes, and wherein the drain electrode comprises a first drain electrode and a second drain electrode that are separated from each other, and a third drain electrode electrically connecting the first and second drain electrodes,
wherein the insulating layer has a flat portion and a non-flat portion, wherein i) at least part of the first source electrode, ii) at least part of the first drain electrode and iii) the second source and drain electrodes are formed on the flat portion of the insulating layer, and wherein at least part of the third source electrode and at least part of the third drain electrode are formed substantially directly above the non-flat portion of the insulating layer.

* * * * *